(12) United States Patent
Dhoble et al.

(10) Patent No.: US 8,430,293 B2
(45) Date of Patent: *Apr. 30, 2013

(54) CURABLE AMINE, CARBOXYLIC ACID FLUX COMPOSITION AND METHOD OF SOLDERING

(75) Inventors: Avin V. Dhoble, Waltham, MA (US); Mark R. Winkle, Lansdale, PA (US); Michael K. Gallagher, Hopkinton, MA (US); Kim S. Ho, Richboro, PA (US); Xiang-Qian Liu, Collegeville, PA (US); Asghar A. Peera, Cary, IL (US); Glenn N. Robinson, Naperville, IL (US); Ian A. Tomlinson, Midland, MI (US); David Fleming, Northborough, MA (US)

(73) Assignee: Rohm and Haas Electronic Materials LLC, Marlborough, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/250,125

(22) Filed: Sep. 30, 2011

(65) Prior Publication Data

US 2013/0082092 A1 Apr. 4, 2013

(51) Int. Cl.
B23K 31/02 (2006.01)
B23K 35/34 (2006.01)

(52) U.S. Cl.
USPC ...... 228/180.21; 228/207; 228/223; 228/224; 228/248.1; 148/23; 148/24

(58) Field of Classification Search .......................... None
See application file for complete search history.

(56) References Cited

U.S. PATENT DOCUMENTS

| | | | |
|---|---|---|---|
| 2,632,022 A | 3/1959 | Bortnick | |
| 2,897,179 A | 7/1959 | Schecter et al. | |
| 3,488,831 A | 1/1970 | Ravve | |
| 3,814,638 A | 1/1970 | Warwick et al. | |
| 3,740,831 A | 6/1973 | Jordan et al. | |
| 3,944,123 A * | 3/1976 | Jacobs | 228/223 |
| 4,028,143 A | 6/1977 | Stayner et al. | |
| 4,165,244 A | 8/1979 | Jacobs | |
| 4,196,024 A | 4/1980 | Kenyon | |
| 4,360,144 A | 11/1982 | Cuddy et al. | |
| RE32,309 E | 12/1986 | Hwang | |
| 5,004,509 A * | 4/1991 | Bristol | 148/23 |
| 5,011,546 A | 4/1991 | Frazier et al. | |
| 5,145,722 A | 9/1992 | Kaspaul | |
| 5,417,771 A * | 5/1995 | Arita et al. | 148/23 |
| 5,531,838 A | 7/1996 | Arldt et al. | |
| 5,571,340 A | 11/1996 | Schneider et al. | |
| 5,863,355 A | 1/1999 | Ohno et al. | |
| 5,932,030 A | 8/1999 | Fukasawa et al. | |
| 5,958,151 A | 9/1999 | Gao et al. | |
| 5,989,362 A | 11/1999 | Diamant et al. | |
| 6,075,080 A * | 6/2000 | Katsuoka et al. | 524/272 |
| 6,217,671 B1 | 4/2001 | Henderson et al. | |
| 6,234,381 B1 | 5/2001 | Hasegawa et al. | |
| 6,367,150 B1 | 4/2002 | Kirsten | |
| 6,746,896 B1 * | 6/2004 | Shi et al. | 438/108 |
| 6,758,389 B1 | 7/2004 | Odaka et al. | |
| 6,887,319 B2 | 5/2005 | Suga et al. | |
| 6,926,849 B2 | 8/2005 | Taguchi et al. | |
| 7,575,150 B2 | 8/2009 | Saito et al. | |
| 2001/0019075 A1 * | 9/2001 | Abe et al. | 228/224 |
| 2001/0045244 A1 | 11/2001 | Akaike et al. | |
| 2002/0190370 A1 | 12/2002 | Shi et al. | |
| 2003/0051770 A1 * | 3/2003 | Nishina et al. | 148/23 |
| 2003/0111519 A1 | 6/2003 | Kinney et al. | |
| 2003/0159761 A1 | 8/2003 | Ikeda et al. | |
| 2004/0026484 A1 * | 2/2004 | Yamashita et al. | 228/180.22 |
| 2005/0067395 A1 | 3/2005 | Shindo et al. | |
| 2005/0131106 A1 | 6/2005 | Tonapi et al. | |
| 2005/0170188 A1 | 8/2005 | Campbell et al. | |
| 2006/0068521 A1 * | 3/2006 | Shi et al. | 438/108 |
| 2006/0102691 A1 | 5/2006 | Toyama et al. | |
| 2006/0147683 A1 | 7/2006 | Ikeda et al. | |
| 2006/0272747 A1 | 12/2006 | Wang et al. | |
| 2006/0275608 A1 | 12/2006 | Tonapi et al. | |
| 2007/0241170 A1 | 10/2007 | Ikeda et al. | |
| 2007/0277373 A1 | 12/2007 | Takai et al. | |
| 2008/0023108 A1 | 1/2008 | Wang et al. | |

(Continued)

FOREIGN PATENT DOCUMENTS

DE 2828197 A * 1/1980

OTHER PUBLICATIONS

Copending U.S. Appl. No. 12/958,495.
Copending U.S. Appl. No. 12/958,487.
Copending U.S. Appl. No. 12/958,480.
Copending U.S. Appl. No. 12/958,493.
Copending U.S. Appl. No. 12/958,473.
Copending U.S. Appl. No. 13/250,226.
Copending U.S. Appl. No. 13/250,007.
Copending U.S. Appl. No. 13/250,184.
Copending U.S. Appl. No. 13/250,297.

Primary Examiner — Kiley Stoner
(74) Attorney, Agent, or Firm — Thomas G. Deibert

(57) ABSTRACT

A curable flux composition is provided, comprising, as initial components: a resin component having at least two oxirane groups per molecule; a carboxylic acid; and, an amine fluxing agent represented by formula I:

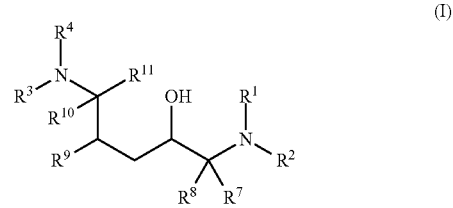

(I)

and, optionally, a curing agent. Also provided is a method of soldering an electrical contact using the curable flux composition.

10 Claims, No Drawings

U.S. PATENT DOCUMENTS

| | | |
|---|---|---|
| 2008/0124568 A1 | 5/2008 | Duchesne et al. |
| 2008/0156852 A1 | 7/2008 | Prakash |
| 2008/0179383 A1 | 7/2008 | Sakurai et al. |
| 2009/0018239 A1 | 1/2009 | Woods et al. |
| 2009/0320960 A1* | 12/2009 | Nishina et al. ............ 148/24 |
| 2010/0143658 A1 | 6/2010 | Lawrence |
| 2010/0175790 A1 | 7/2010 | Duchesne et al. |
| 2011/0100512 A1 | 5/2011 | Bedard et al. |

* cited by examiner

CURABLE AMINE, CARBOXYLIC ACID FLUX COMPOSITION AND METHOD OF SOLDERING

The present invention relates to a curable flux composition comprising, as initial components: a resin component having at least two oxirane groups per molecule; a carboxylic acid; and, an amine fluxing agent represented by formula I, wherein $R^1$, $R^2$, $R^3$ and $R^4$ are independently selected from a hydrogen, a substituted $C_{1-80}$ alkyl group, an unsubstituted $C_{1-80}$ alkyl group, a substituted $C_{7-80}$ arylalkyl group and an unsubstituted $C_{7-50}$ arylalkyl group; wherein $R^7$ and $R^8$ are independently selected from a $C_{1-20}$ alkyl group, a substituted $C_{1-20}$ alkyl group, a $C_{6-20}$ aryl group and a substituted $C_{6-20}$ aryl group or wherein $R^7$ and $R^8$, together with the carbon to which they are attached, form a $C_{3-20}$ cycloalkyl ring optionally substituted with a $C_{1-6}$ alkyl group; wherein $R^{10}$ and 11 are independently selected from a $C_{1-20}$ alkyl group, a substituted $C_{1-20}$ alkyl group, a $C_{6-20}$ aryl group and a substituted $C_{6-20}$ aryl group or wherein $R^{10}$ and $R^{11}$, together with the carbon to which they are attached, form a $C_{3-20}$ cycloalkyl ring optionally substituted with a $C_{1-6}$ alkyl group; and, wherein $R^9$ is selected from a hydrogen, a $C_{1-30}$ alkyl group, a substituted $C_{1-30}$ alkyl group, a $C_{6-30}$ aryl group and a substituted $C_{6-30}$ aryl group; and, optionally, a curing agent. The present invention further relates to a method of soldering an electrical contact using the curable flux composition.

Flux is an important tool used in the manufacture of electrical devices, including mounting of an electronic component (e.g., a semiconductor chip) onto a substrate (e.g., a printed circuit board, printed circuit card, organic substrate, silicon interposer, another semiconductor chip).

The flip chip method is an increasingly important method used for mounting electronic components onto a substrate. In one example of a flip chip method used to mount a semiconductor chip on a substrate, solder is provided (e.g., as solder balls) on contacts located on the semiconductor chip (e.g., contact pads, contact pins). Alternatively, solder is provided on corresponding contacts located on the substrate (e.g., contact pads, copper plated through holes). A flux is applied to the solder to remove oxide layers that may be present on the surface of the solder or on the surface of the contacts on the semiconductor chip or the substrate. The flux also functions to provide increased wetting of the contacts by the solder during reflow. The solder or contacts on the semiconductor chip are then brought into physical contact with the corresponding contacts or solder on the substrate. The solder on the semiconductor chip and/or the substrate is then heated to reflow. Upon cooling, inter connections between the semiconductor chip and the substrate are formed. Typically, these inter connections are subsequently encapsulated (e.g., with an epoxy resin) to enhance reliability of the semiconductor chip/substrate assembly. That is, the encapsulating resin helps to relieve strains that may otherwise develop given differences in the coefficient of thermal expansion of the semiconductor chip and the substrate.

The actual choice of the flux used in the above described process is very important. The use of many conventional fluxes, result in the formation of undesirable ionic residues that may reduce the reliability of the product device. Accordingly, such undesirable ionic residues must be cleaned from the device. Cleaning of such devices, however, is hindered by the fact that the distance between a semiconductor chip and a substrate (e.g., printed circuit board) following formation of soldered inter connections is very small. This significantly complicates the process of removing any undesirable ionic residues formed during the soldering process.

Conventionally, curable organic materials (typically containing organic or inorganic fillers) are used to fill the gap between the semiconductor chip and the substrate and to reinforce the solder joints electrically interconnecting the semiconductor chip and the substrate. These underfill materials rely on capillary action to fill the gap.

The gap between the semiconductor chip and the substrate must be completely filled to provide maximum reliability to the product electrical component. However, when the curable organic material is applied at the periphery of the gap between the semiconductor chip and the substrate, voids at the center area of the gap can remain. As the size of the electrical component shrinks (i.e., the height of the gap gets smaller), the limiting effect of capillary action causes the non-filled center region to expand.

To address this issue, some have provided a hole in the substrate correspondingly near the center of the gap region. Underfill material is then supplied to the gap through this hole and to the periphery. This approach, however, requires device designs to provide a region free of circuitry to facilitate the location of the center hole.

Another approach to the underfill issue has come to be referred to as a "no flow" process, wherein an underfill material is preapplied onto the semiconductor chip and/or the substrate before soldering. This material subsequently occupies the gap between the semiconductor chip and the substrate upon soldering to form an interconnected component and is cured (typically by application of heat).

In such no flow processes, it is known to use an underfill material that provides both fluxing and encapsulating functionalities. Such materials reduce the number of steps required to package semiconductor chips on substrates. That is, these materials combine the fluxing and underfill steps into one and eliminate the need for a cleaning step.

One such no flow underfill material is disclosed by Pennisi et al. in U.S. Pat. No. 5,128,746. Pennisi et al. disclose a thermally curable adhesive having a fluxing agent for use in reflow soldering an electrical component and a substrate, comprising an adhesive that removes oxide coatings from the electrical component or the substrate and at least partially cures when heated to soldering temperatures, said adhesive consisting essentially of a thermoset resin, a fluxing agent in an amount sufficient to remove said oxide coatings from said component or said substrate, and a curing agent that reacts with and cures the thermoset resin when the thermally curable adhesive is heated.

Another no flow underfill approach is disclosed by Chen et al. in U.S. Pat. No. 7,303,944. Chen et al. disclose a method comprising: applying an underfill material containing an anhydride adduct of a rosin compound as a fluxing agent over a contact pad over a surface of a substrate; placing a microelectronic device having an active surface, and a plurality of solder bumps disposed on a plurality of contact pads on the active surface, relative to the substrate, with the plurality of solder bumps disposed within the no flow underfill material; removing a metal oxide from the solder bumps with the fluxing agent; reflowing the solder bumps by heating to a temperature that is greater than a melting point temperature of the solder; and curing the underfill material.

Many of the conventional no flow underfill materials like those noted are built on epoxy chemistry and rely on carboxylic acids or anhydrides to provide fluxing. Also, organic alcohols are periodically used as accelerators, given that they react with anhydrides to form carboxylic acid fluxing agents. Carboxylic acids, however, tend to be volatile during the soldering and encapsulating process. This is undesirable in that it can create voids in the gap between the semiconductor chip and the substrate that reduce the reliability of the product device. Accordingly, there remains a need for curable fluxing materials that facilitate the manufacture of reliable soldered and encapsulated inter connects in electrical components (e.g., inter connects between a semiconductor chip and a printed circuit board).

The present invention provides a curable flux composition, comprising, as initial components: a resin component having at least two oxirane groups per molecule; a carboxylic acid; an amine fluxing agent represented by formula I:

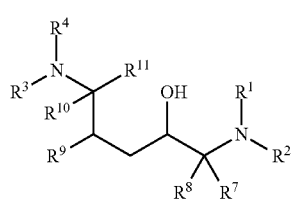

wherein $R^1$, $R^2$, $R^3$ and $R^4$ are independently selected from a hydrogen, a substituted $C_{1-80}$ alkyl group, an unsubstituted $C_{1-80}$ alkyl group, a substituted $C_{7-80}$ arylalkyl group and an unsubstituted $C_{7-80}$ arylalkyl group; wherein $R^7$ and $R^8$ are independently selected from a $C_{1-20}$ alkyl group, a substituted $C_{1-20}$ alkyl group, a $C_{6-20}$ aryl group and a substituted $C_{6-20}$ aryl group or wherein $R^7$ and $R^8$, together with the carbon to which they are attached, form a $C_{3-20}$ cycloalkyl ring optionally substituted with a $C_{1-6}$ alkyl group; wherein $R^{10}$ and $R^{11}$ are independently selected from a $C_{1-20}$ alkyl group, a substituted $C_{1-20}$ alkyl group, a $C_{6-20}$ aryl group and a substituted $C_{6-20}$ aryl group or wherein $R^{10}$ and $R^{11}$, together with the carbon to which they are attached, form a $C_{3-20}$ cycloalkyl ring optionally substituted with a $C_{1-6}$ alkyl group; and, wherein $R^9$ is selected from a hydrogen, a $C_{1-30}$ alkyl group, a substituted $C_{1-30}$ alkyl group, a $C_{6-30}$ aryl group and a substituted $C_{6-30}$ aryl group; and, optionally, a curing agent.

The present invention provides a process of forming an encapsulated metallurgical joint, comprising: providing a curable flux composition of the present invention; providing a plurality of first electrical contacts; providing a plurality of corresponding second electrical contacts; providing a solder; applying the curable flux composition to at least one of the plurality of first electrical contacts and the plurality of corresponding second electrical contacts; placing the plurality of first electrical contacts in proximity to the plurality of corresponding second electrical contacts; heating the solder above its reflow temperature forming a molten solder and exposing the molten solder to the plurality of first electrical contacts and the plurality of corresponding second electrical contacts; displacing the curable flux composition from the plurality of first electrical contacts and the plurality of corresponding second electrical contacts with the molten solder and forming a plurality of electrical inter connects between the plurality of first electrical contacts and the plurality of corresponding second electrical contacts; and, curing the resin component, encapsulating the plurality of electrical inter connects.

DETAILED DESCRIPTION

The curable flux composition of the present invention is designed to facilitate the manufacture of electrical components having soldered and encapsulated electrical inter connects. For example, the curable flux composition of the present invention is preferably designed to function as a no flow underfill formulation in the manufacture of semiconductor devices.

The term "no flow underfill composition" as used herein and in the appended claims refers to a curable flux composition that exhibits both solder fluxing activity and latent curing to facilitate encapsulation of soldered inter connects.

The term "storage stability" as used herein and in the appended claims in reference to a curable flux composition of the present invention (in a one pack system) means that the viscosity of the curable flux composition increases less than 5% following storage at 55° C. for one week, wherein the viscosity is measured using a Brookfield DV-I+ Viscometer at 20° C. using a Brookfield #S00 spindle set at 100 rpm.

The term "storage stable" as used herein and in the appended claims in reference to a curable flux composition of the present invention means that the curable flux composition exhibits storage stability.

The curable flux composition of the present invention comprises (consists essentially of), as initial components: a resin component having at least two oxirane groups per molecule; a carboxylic acid; an amine fluxing agent represented by formula I; and, optionally, a curing agent. Preferably, the curable flux composition contains less than 10 wt % material that volatilizes upon heating to 250° C. as determined by thermogravimetric analysis (TGA) using a temperature ramp of 10° C./min. starting at 25° C. Evolution of gases from underfill compositions tends to cause voids in the gap between the semiconductor wafer and the substrate, resulting in potential reliability concerns for the product packaged device.

The resin component used in the curable flux composition of the present invention includes materials having at least two oxirane groups per molecule. Preferably, the resin component used is an epoxy resin having at least two epoxide groups per molecule, for example, substituted or unsubstituted aliphatic, cycloaliphatic, aromatic and heterocyclic polyepoxides. More preferably the resin component is an epoxy resin selected from bisphenol type epoxy resin (e.g., bisphenol A type epoxy resin, bisphenol F type epoxy resin, bisphenol S type epoxy resin); aromatic diglycidyl ethers; aromatic multifunctional glycidyl ethers; aliphatic diglycidyl ethers and aliphatic multifunctional glycidyl ethers. Still more preferably the resin component is a bisphenol type epoxy resin. Most preferably the resin component is a bisphenol A type epoxy resin. The curable flux composition preferably comprises 10 to 99 wt % (more preferably 20 to 90 wt %; still more preferably 30 to 75 wt %, most preferably 30 to 50 wt %) resin component.

The resin component used in the curable flux composition of the present invention, optionally, further includes a material having at least three oxirane groups per molecule. Material having at least three oxirane groups per molecule is optionally included in the resin component to increase the glass transition temperature of the cured resin product and to reduce the gellation time for the formulation.

Preferably, the carboxylic acid used in the flux composition of the present invention, is selected from $C_{8-20}$ aliphatic mono carboxylic acids; $C_{2-20}$ aliphatic dicarboxylic acids; $C_{6-20}$ aromatic carboxylic acids; and, mixtures thereof. More preferably, the carboxylic acid used in the flux composition of the present invention is selected from octanoic acid; nonanioc acid; undecanoic acid; dodecanoic acid; tridecanoic acid; tetradecanoic acid; pentadecanoic acid; hexadecanoic acid; heptadecanoic acid; stearic acid; hydroxy stearic acid; oleic acid; linoleic acid; α-linolenic acid; icosanoic acid; oxalic acid; malonic acid; succinic acid; malic acid; glutaric acid;

adipic acid; pimelic acid; suberic acid; benzoic acid; phthalic acid; isophthalic acid; terephthalic acid; hemimellitic acid; trimellitic acid; trimesic acid; mellophanic acid; prehnitic acid; pyromellitic acid; mellitic acid; toluic acid; xylic acid; hemellitic acid; mesitylene acid; prehnitic acid; cinnamic acid; salicylic acid; benzoic acid (e.g., benzoic acid; 2,3-dihydroxybenzoic acid; 2,4-dihydroxybenzoic acid; 2,5-dihydroxybenzoic acid (gentisic acid); 2,6-dihydroxybenzoic acid; 3,5-dihydroxybenzoic acid; 3,4,5-trihydroxybenzoic acid (gallic acid)); naphthoic acid (e.g., naphthoic acid; 1,4-dihydroxy-2-naphthoic acid; 3,5-dihydroxy-2-naphthoic acid; 3,7-dihydroxy-2-naphthoic acid); phenolphthalin; diphenolic acid and mixtures thereof. Still more preferably, the carboxylic acid used in the flux composition of the present invention is selected from naphthoic acid (e.g., naphthoic acid; 1,4-dihydroxy-2-naphthoic acid; 3,5-dihydroxy-2-naphthoic acid; 3,7-dihydroxy-2-naphthoic acid), stearic acid; hydroxy stearic acid; oleic acid; linoleic acid; α-linolenic acid; and icosanoic acid; and, mixtures thereof. Yet still more preferably, the carboxylic acid used in the flux composition of the present invention is selected from naphthoic acid (e.g., naphthoic acid; 1,4-dihydroxy-2-naphthoic acid; 3,5-dihydroxy-2-naphthoic acid; 3,7-dihydroxy-2-naphthoic acid), stearic acid; hydroxy stearic acid; oleic acid; and, mixtures thereof. Most preferably, the carboxylic acid used in the flux composition of the present invention is selected from naphthoic acid, a $C_{1-8}$ carboxylic acid and mixtures thereof; wherein the naphthoic acid is selected from 1,4-dihydroxy-2-naphthoic acid; 3,5-dihydroxy-2-naphthoic acid; and the $C_{18}$ carboxylic acid is selected from stearic acid, hydroxy stearic acid, and oleic acid.

The amine fluxing agent used in the curable flux composition of the present invention is according to formula I, wherein $R^1$, $R^2$, $R^3$ and $R^4$ are independently selected from hydrogen, a substituted $C_{1-80}$ alkyl group, an unsubstituted $C_{1-80}$ alkyl group, a substituted $C_{7-80}$ arylalkyl group and an unsubstituted $C_{7-80}$ arylalkyl group (preferably wherein $R^1$, $R^2$, $R^3$ and $R^4$ are independently selected from a hydrogen, a substituted $C_{1-20}$ alkyl group, an unsubstituted $C_{1-20}$ alkyl group, a substituted $C_{7-30}$ arylalkyl group and an unsubstituted $C_{7-30}$ arylalkyl group); wherein $R^7$ and $R^8$ are independently selected from a $C_{1-20}$ alkyl group, a substituted $C_{1-20}$ alkyl group, a $C_{6-20}$ aryl group and a substituted $C_{6-20}$ aryl group (alternatively, wherein $R^7$ and $R^8$, together with the carbon to which they are attached, form a $C_{3-20}$ cycloalkyl ring optionally substituted with a $C_{1-6}$ alkyl group); wherein $R^{10}$ and $R^{11}$ are independently selected from a $C_{1-20}$ alkyl group, a substituted $C_{1-20}$ alkyl group, a $C_{6-20}$ aryl group and a substituted $C_{6-20}$ aryl group (alternatively, wherein $R^{10}$ and $R^{11}$, together with the carbon to which they are attached, form a $C_{3-20}$ cycloalkyl ring optionally substituted with a $C_{1-6}$ alkyl group); and, wherein $R^9$ is selected from a hydrogen, a $C_{1-30}$ alkyl group, a substituted $C_{1-30}$ alkyl group, a $C_{6-30}$ aryl group and a substituted $C_{6-30}$ aryl group. Preferably, zero to three of $R^1$, $R^2$, $R^3$ and $R^4$ is(are) hydrogen. The $R^1$, $R^2$, $R^3$, $R^4$, $R^7$, $R^8$, $R^9$, $R^{10}$ and groups of the amine fluxing agent according to formula I are preferably selected: to provide the amine fluxing agent with desirable rheological properties for a given application; to facilitate the formation of the fluxing complex with the carboxylic acid; optionally, to compatibilize the amine fluxing agent with a given solvent package for delivery to the surface(s) to be soldered; and, optionally, to compatibilize the amine fluxing agent with a given encapsulating composition (e.g., an epoxy resin) to be used post soldering to form an encapsulated solder joint (e.g., for use in conventional flip chip under fill applications). Also, the $R^1$, $R^2$, $R^3$, $R^4$, $R^7$, $R^8$, $R^9$, $R^{10}$ and $R^{11}$ to groups of the amine fluxing agent according formula I are preferably selected to provide the amine fluxing agent with a boiling point temperature of $\geq 125°$ C. (more preferably $\geq 250$), determined by differential scanning calorimetry using a ramp of 10° C./min starting at 25° C.

Preferably, the amine fluxing agent used in the curable flux composition of the present invention is according to formula I; wherein $R^1$, $R^2$, $R^3$ and $R^4$ are independently selected from a hydrogen, a substituted $C_{1-80}$ alkyl group, an unsubstituted $C_{1-80}$ alkyl group, a substituted $C_{7-80}$ arylalkyl group and an unsubstituted $C_{7-80}$ arylalkyl group; and, wherein the substitutions in the substituted $C_{1-80}$ alkyl group and the substituted $C_{7-80}$ arylalkyl group are selected from at least one of an —OH group, an —OR$^5$ group, a —COR$^5$— group, a —COR$^5$ group, a —C(O)R$^5$ group, a —CHO group, a —COOR$^5$ group, an —OC(O)OR$^5$ group, a —S(O)(O)R$^5$ group, a —S(O)R$^5$ group, a —S(O)(O)NR$^5_2$ group, an —OC(O)NR$^6_2$ group, a —C(O)NR$^6_2$ group, a —CN group, a —N(R$^6$)— group and a —NO$_2$ group (preferably at least one of an —OH group, an —OR$^5$ group, a —COR$^5$— group, a —COR$^5$ group, a —C(O)R$^5$ group, a —CHO group, a —COOR$^5$ group, an —OC(O)OR$^5$ group, a —S(O)(O)R$^5$ group, a —S(O)R$^5$ group, a —S(O)(O)NR$^5_2$ group, an —OC(O)NR$^6_2$ group, a —C(O)NR$^6_2$ group, a —CN group and a —NO$_2$ group); wherein R$^5$ is selected from a $C_{1-28}$ alkyl group, a $C_{3-28}$ cycloalkyl group, a $C_{6-15}$ aryl group, a $C_{7-28}$ arylalkyl group and a $C_{7-28}$ alkylaryl group; wherein R$^6$ is selected from a hydrogen, a $C_{1-28}$ alkyl group, a $C_{3-28}$ cycloalkyl group, a $C_{6-15}$ aryl group, a $C_{7-28}$ arylalkyl group and a $C_{7-28}$ alkylaryl group. The substituted $C_{1-80}$ alkyl group and the substituted $C_{7-80}$ arylalkyl group can contain combinations of substitutions. For example, the substituted $C_{1-80}$ alkyl group and the substituted $C_{7-80}$ arylalkyl group can: contain more than one of the same type of substitution (e.g., two —OH groups); contain more than one type of substitution (e.g., an —OH group and a —COR$^5$— group); contain more than one type of substitution with more than one of the same type of substitution (e.g., two —OH groups and an —OR$^5$ group).

Preferably, the amine fluxing agent used in the curable flux composition of the present invention is according to formula I; wherein $R^7$ and $R^8$ are independently selected from a $C_{1-20}$ alkyl group, a substituted $C_{1-20}$ alkyl group, a $C_{6-20}$ aryl group and a substituted $C_{6-20}$ aryl group (alternatively, wherein $R^7$ and $R^8$, together with the carbon to which they are attached, form a $C_{3-20}$ cycloalkyl ring optionally substituted with a $C_{1-6}$ alkyl group); wherein the substitutions in the substituted $C_{1-20}$ alkyl group and the substituted $C_{6-20}$ aryl group are selected from at least one of an —OH group, a phenyl group, a $C_{1-14}$ alkyl groupon —OR$^{12}$ group, a —COR$^{12}$— group, a —COR$^{12}$ group, a —C(O)R$^{12}$ group, a —CHO group, a —COOR$^{12}$ group, an —OC(O)OR$^{12}$ group, a —S(O)(O)R$^{12}$ group, a —S(O)R$^{12}$ group, a —S(O)(O)NR$^{12}_2$ group, an —OC(O)NR$^{13}_2$ group, a —C(O)NR$^{13}_2$ group, a —CN group, a —N(R$^{13}$)— group and a —NO$_2$ group (preferably at least one of an —OH group, an —OR$^{12}$ group, a —COR$^{12}$— group, a —COR$^{12}$ group, a —C(O)R$^{12}$ group, a —CHO group, a —COOR$^{12}$ group, an —OC(O)OR$^{12}$ group, a —S(O)(O)R$^{12}$ group, a —S(O)R$^{12}$ group, a —S(O)(O)NR$^{12}_2$ group, an —OC(O)NR$^{13}_2$ group, a —C(O)NR$^{13}_2$ group, a —CN group and a —NO$_2$ group); wherein R$^{12}$ is selected from a $C_{1-19}$ alkyl group, a $C_{3-19}$ cycloalkyl group, a $C_{6-19}$ aryl group, a $C_{7-19}$ arylalkyl group and a $C_{7-19}$ alkylaryl group; and wherein R$^{13}$ is selected from a hydrogen, a $C_{1-19}$ alkyl group, a $C_{3-19}$ cycloalkyl group, a $C_{6-19}$ aryl group, a $C_{7-19}$ arylalkyl group and a $C_{7-19}$ alkylaryl group. The substituted $C_{1-20}$ alkyl group and the substituted $C_{6-70}$ aryl group can contain combinations of substitutions. For example, the substituted $C_{1-20}$ alkyl group and the substituted $C_{6-20}$ aryl group can: contain more than one of the same type of substitution (e.g., two —OH groups); contain more than one type of substitution (e.g., an —OH group and a —COR$^{12}$— group); contain more than one type of substitution with more than one of the same type of substitution (e.g., two —OH groups and an —OR$^{12}$ group).

Preferably, the amine fluxing agent used in the curable flux composition of the present invention is according to formula I; wherein $R^{10}$ and $R^{11}$ are independently selected from a $C_{1-20}$ alkyl group, a substituted $C_{1-20}$ alkyl group, a $C_{6-20}$ aryl group and a substituted $C_{6-20}$ aryl group (alternatively, wherein $R^{10}$ and $R^{11}$, together with the carbon to which they are attached, form a $C_{3-20}$ cycloalkyl ring optionally substituted with a $C_{1-6}$ alkyl group); and, wherein the substitutions in the substituted $C_{1-20}$ alkyl group and the substituted $C_{6-20}$ aryl group are selected from at least one of an —OH group, an —OR$^{12}$ group, a —COR$^{12}$— group, a —COR$^{12}$ group, a —C(O)R$^{12}$ group, a —CHO group, a —COOR$^{12}$ group, an —OC(O)OR$^{12}$ group, a —S(O)(O)R$^{12}$ group, a —S(O)R$^{12}$ group, a —S(O)(O)NR$^{12}$$_2$ group, an —OC(O)NR$^{13}$$_2$ group, a —C(O)NR$^{13}$$_2$ group, a —CN group, a —N(R$^{13}$)— group and a —NO$_2$ group (preferably at least one of an —OH group, an —OR$^{12}$ group, a —COR$^{12}$— group, a —COR$^{12}$ group, a —C(O)R$^{12}$ group, a —CHO group, a —COOR$^{12}$ group, an —OC(O)OR$^{12}$ group, a —S(O)(O)R$^{12}$ group, a —S(O)R$^{12}$ group, a —S(O)(O)NR$^{12}$$_2$ group, an —OC(O)NR$^{13}$$_2$ group, a —C(O)NR$^{13}$$_2$ group, a —CN group and a —NO$_2$ group); wherein $R^{12}$ is selected from a $C_{1-19}$ alkyl group, a $C_{3-19}$ cycloalkyl group, a $C_{6-19}$ aryl group, a $C_{7-19}$ arylalkyl group and a $C_{7-19}$ alkylaryl group; and wherein $R^{13}$ is selected from a hydrogen, a $C_{1-19}$ alkyl group, a $C_{3-19}$ cycloalkyl group, a $C_{6-19}$ aryl group, a $C_{7-19}$ arylalkyl group and a $C_{7-19}$ alkylaryl group. The substituted $C_{1-20}$ alkyl group and the substituted $C_{6-20}$ aryl group can contain combinations of substitutions. For example, the substituted $C_{1-20}$ alkyl group and the substituted $C_{6-20}$ aryl group can: contain more than one of the same type of substitution (e.g., two —OH groups); contain more than one type of substitution (e.g., an —OH group and a —COR$^{12}$— group); contain more than one type of substitution with more than one of the same type of substitution (e.g., two —OH groups and an —OR$^{12}$ group).

Preferably, the amine fluxing agent used in the curable flux composition of the present invention is according to formula I; wherein $R^9$ is selected from a hydrogen, a $C_{1-30}$ alkyl group, a substituted $C_{1-30}$ alkyl group, a $C_{6-30}$ aryl group and a substituted $C_{6-30}$ aryl group; and, wherein the substitutions in the substituted $C_{1-30}$ alkyl group and the substituted $C_{6-30}$ aryl group are selected from at least one of an —OH group, an —OR$^{14}$ group, a —COR$^N$— group, a —COR$^{14}$ group, a —C(O)R$^{14}$ group, a —CHO group, a —COOR$^{14}$ group, an —OC(O)OR$^{14}$ group, a —S(O)(O)R$^{14}$ group, a —S(O)R$^{14}$ group, a —S(O)(O)NR$^{14}$$_2$ group, an —OC(O)NR$^{15}$$_2$ group, a —C(O)NR$^{15}$$_2$ group, a —CN group, a —N(R$^{15}$)— group and a —NO$_2$ group (preferably at least one of an —OH group, an —OR$^{14}$ group, a —COR$^{14}$— group, a —COR$^{14}$ group, a —C(O)R$^{14}$ group, a —CHO group, a —COOR$^{14}$ group, an —OC(O)OR$^{14}$ group, a —S(O)(O)R$^{14}$ group, a —S(O)R$^{14}$ group, a —S(O)(O)NR$^{14}$$_2$ group, an —OC(O)NR$^{15}$$_2$ group, a —C(O)NR$^{15}$$_2$ group, a —CN group and a —NO$_2$ group); wherein $R^{14}$ is selected from a $C_{1-29}$ alkyl group, a $C_{3-29}$ cycloalkyl group, a $C_{6-29}$ aryl group, a $C_{7-29}$ arylalkyl group and a $C_{7-29}$ alkylaryl group; and wherein $R^{15}$ is selected from a hydrogen, a $C_{1-29}$ alkyl group, a $C_{3-29}$ cycloalkyl group, a $C_{6-29}$ aryl group, a $C_{7-29}$ arylalkyl group and a $C_{7-29}$ alkylaryl group. The substituted $C_{1-30}$ alkyl group and the substituted $C_{6-30}$ aryl group can contain combinations of substitutions. For example, the substituted $C_{1-30}$ alkyl group and the substituted $C_{6-30}$ aryl group can: contain more than one of the same type of substitution (e.g., two —OH groups); contain more than one type of substitution (e.g., an —OH group and a —COR$^{14}$— group); contain more than one type of substitution with more than one of the same type of substitution (e.g., two —OH groups and an —OR$^{14}$ group).

More preferably, the amine fluxing agent used in the curable flux composition of the present invention is according to formula I; wherein $R^1$, $R^2$, $R^3$ and $R^4$ are independently selected from a hydrogen, a substituted $C_{1-20}$ alkyl group, an unsubstituted $C_{1-20}$ alkyl group, a substituted $C_{7-30}$ arylalkyl group and an unsubstituted $C_{7-30}$ arylalkyl group; and, wherein the substitutions in the substituted $C_{1-20}$ alkyl group and the substituted $C_{7-30}$ arylalkyl group are selected from at least one of an —OH group, an —OR$^{16}$ group, a —COR$^{16}$— group, a —COR$^{16}$ group, a —C(O)R$^{16}$ group, a —CHO group, a —COOR$^{16}$ group, an —OC(O)OR$^{16}$ group, a —S(O)(O)R$^{16}$ group, a —S(O)R$^{16}$ group, a —S(O)(O)NR$^{16}$$_2$ group, an —OC(O)NR$^{17}$$_2$ group, a —C(O)NR$^{17}$$_2$ group, a —CN group, a —N(R$^{17}$)— group and a —NO$_2$ group (preferably at least one of an —OH group, an —OR$^{16}$ group, a —COR$^{16}$— group, a —COR$^{16}$ group, a —C(O)R$^{16}$ group, a —CHO group, a —COOR$^{16}$ group, an —OC(O)OR$^{16}$ group, a —S(O)(O)R$^{16}$ group, a —S(O)R$^{16}$ group, a —S(O)(O)NR$^{16}$$_2$ group, an —OC(O)NR$^{17}$2 group, a —C(O)NR$^{17}$$_2$ group, a —CN group and a —NO$_2$ group); wherein $R^{16}$ is selected from a $C_{1-19}$ alkyl group, a $C_{3-19}$ cycloalkyl group, a $C_{6-15}$ aryl group, a $C_{7-19}$ arylalkyl group and a $C_{7-19}$ alkylaryl group; wherein $R^{17}$ is selected from a hydrogen, a $C_{1-19}$ alkyl group, a $C_{3-19}$ cycloalkyl group, a $C_{6-15}$ aryl group, a $C_{7-19}$ arylalkyl group and a $C_{7-19}$ alkylaryl group; wherein $R^7$ and $R^8$ are independently selected from a $C_{1-4}$ alkyl group and a $C_{1-4}$ hydroxy alkyl group (more preferably wherein $R^7$ and $R^8$ are independently selected from a methyl group and a hydroxy methyl group; most preferably wherein $R^7$ and $R^8$ are both a methyl group); wherein $R^{10}$ and $R^{11}$ are independently selected from a $C_{1-4}$ alkyl group and a $C_{1-4}$ hydroxy alkyl group (more preferably wherein $R^{10}$ and $R^{11}$ are independently selected from a methyl group and a hydroxy methyl group; most preferably wherein $R^{10}$ and $R^{11}$ are both a methyl group); and, wherein $R^9$ is selected from a hydrogen, a $C_{1-10}$ alkyl group, a $C_{1-10}$ hydroxyalkyl group, a phenyl group, a hydroxyphenyl group, a $C_{7-10}$ alkylaryl group, a $C_{7-40}$ arylalkyl group and a naphthyl group (more preferably wherein $R^9$ is selected from a hydrogen, a $C_{1-4}$ alkyl group, a $C_{1-4}$ hydroxyl alkyl group, a phenyl group, a hydroxyl phenyl group, a $C_7$ alkylaryl group and a $C_7$ arylalkyl group; most preferably wherein $R^9$ is selected from a methyl group and a phenyl group). The substituted $C_{1-20}$ alkyl group and the substituted $C_{7-30}$ arylalkyl group, from which $R^1$, $R^2$, $R^3$ and $R^4$ are selected, can contain combinations of substitutions. For example, the substituted $C_{1-20}$ alkyl group and the substituted $C_{7-30}$ arylalkyl group can: contain more than one of the same type of substitution (e.g., two —OH groups); contain more than one type of substitution (e.g., an —OH group and a —COR$^{16}$— group); contain more than one type of substitution with more than one of the same type of substitution (e.g., two —OH groups and an —OR$^{16}$ group). Preferably, zero to three of $R^1$, $R^2$, $R^3$ and $R^4$ is(are) hydrogen. More preferably, one to three of $R^1$, $R^2$, $R^3$ and $R^4$ is(are) hydrogen. Still more preferably, two to three of $R^1$, $R^2$, $R^3$ and $R^4$ are hydrogen. Yet still more preferably, two of $R^1$, $R^2$, $R^3$ and $R^4$ are hydrogen. Most preferably, one of $R^1$ and $R^2$ is hydrogen and one of $R^3$ and $R^4$ is hydrogen.

Still more preferably, the amine fluxing agent used in the fluxing composition of the present invention is according to formula I; wherein $R^1$, $R^2$, $R^3$ and $R^4$ are independently selected from a hydrogen, a —$CH_2CH(OH)R^{18}$ and a —$CH_2CH(OH)CH_2$—O—$R^{18}$ group; wherein $R^{18}$ is selected from a hydrogen, a $C_{1-28}$ alkyl group, a $C_{6-15}$ aryl group, a $C_{7-28}$ arylalkyl group and a $C_{7-28}$ alkylaryl group (preferably, wherein $R^{18}$ is selected from a $C_{5-10}$ alkyl group, a $C_{3-10}$ cycloalkyl group, a $C_{6-15}$ aryl group and a $C_{7-15}$ alkylaryl group; most preferably wherein $R^{18}$ is selected from a $C_8$ alkyl group, a $C_7$ alkylaryl group and a $C_{10}$ naphthyl group); wherein $R^7$ and $R^8$ are independently selected from a $C_{1-4}$ alkyl group and a $C_{1-4}$ hydroxy alkyl group (more preferably wherein $R^7$ and $R^8$ independently selected from a methyl group and a hydroxy methyl group; most preferably wherein $R^7$ and $R^8$ are both a methyl group); wherein $R^{10}$ and $R^{11}$ are independently selected from a $C_{1-4}$ alkyl group and a $C_{1-4}$ hydroxy alkyl group (more preferably wherein $R^{10}$ and $R^{11}$ are independently selected from a methyl group and a hydroxy methyl group; most preferably wherein $R^{10}$ and $R^{11}$ are both a methyl group); and, wherein $R^9$ is selected from a hydrogen, a $C_{1-10}$ alkyl group, a $C_{1-10}$ hydroxyalkyl group, a phenyl group, a hydroxyphenyl group, a $C_{7-10}$ alkylaryl group, a $C_{7-10}$ arylalkyl group and a naphthyl group (more preferably wherein $R^9$ is selected from a hydrogen, a $C_{1-4}$ alkyl group, a $C_{1-4}$ hydroxyl alkyl group, a phenyl group, a hydroxyl phenyl group, a $C_7$ alkylaryl group and a $C_7$ arylalkyl group; most preferably wherein $R^9$ is selected from a methyl group and a phenyl group). Preferably, zero to three of $R^1$, $R^2$, $R^3$ and $R^4$ is(are) hydrogen. More preferably, one to three of $R^1$, $R^2$, $R^3$ and $R^4$ is(are) hydrogen. Still more preferably, two to three of $R^1$, $R^2$, $R^3$ and $R^4$ are hydrogen. Yet still more preferably, two of $R^1$, $R^2$, $R^3$ and $R^4$ are hydrogen. Most preferably, one of $R^1$ and $R^2$ is hydrogen and one of $R^3$ and $R^4$ is hydrogen.

Yet still more preferably, the amine fluxing agent used in the curable flux composition of the present invention is according to formula I; wherein $R^1$, $R^2$, $R^3$ and $R^4$ are independently selected from a hydrogen, a —$CH_2CH(OH)R^{18}$ and a —$CH_2CH(OH)CH_2$—O—$R^{18}$ group; wherein $R^{18}$ is selected from a hydrogen, a $C_{1-28}$ alkyl group, a $C_{3-28}$ cycloalkyl group, a $C_{6-16}$ aryl group, a $C_{7-28}$ arylalkyl group and a $C_{7-28}$ alkylaryl group (preferably, wherein $R^{18}$ is selected from a $C_{5-10}$ alkyl group, a $C_{6-16}$ aryl group and a $C_{7-15}$ alkylaryl group; more preferably wherein $R^{18}$ is selected from a $C_8$ alkyl group, a $C_7$ alkylaryl group, a naphthyl group, a biphenyl group and a substituted $C_{12-16}$ biphenyl group; most preferably, wherein $R^{18}$ is selected from a $C_8$ alkyl group, a $C_7$ alkylaryl group and a naphthyl group); wherein $R^7$ and $R^8$ are both a methyl group; wherein $R^{10}$ and $R^{11}$ are both a methyl group; and, wherein $R^9$ is selected from a methyl group and a phenyl group. Preferably, zero to three of $R^1$, $R^2$, $R^3$ and $R^4$ is(are) hydrogen. More preferably, one to three of $R^1$, $R^2$, $R^3$ and $R^4$ is(are) hydrogen. Still more preferably, two to three of $R^1$, $R^2$, $R^3$ and $R^4$ are hydrogen. Yet still more preferably, two of $R^1$, $R^2$, $R^3$ and $R^4$ are hydrogen. Most preferably, $R^1$ and $R^3$ are a hydrogen; and, $R^2$ and $R^4$ are selected from a —$CH_2CH(OH)R^{18}$ and a —$CH_2CH(OH)CH_2$—O—$R^{18}$ group.

Preferably, the curable flux composition of the present invention comprises, as initial components: a carboxylic acid and an amine fluxing agent represented by formula I at an amine fluxing agent amine nitrogen to carboxylic acid content (—COOH) equivalent ratio of 1:1 to 20:1 (more preferably, 1:1 to 10:1; most preferably, 1:1 to 4:1). Preferably, when combined, the carboxylic acid and the amine fluxing agent represented by formula I, form a fluxing complex. Preferably, the fluxing complex formed is an acid-base complex. Preferably, the fluxing complex exhibits a percent weight loss of ≦25 wt % (more preferably ≦20 wt %; most preferably ≦15 wt %) upon heating to 230° C. determined by thermogravimetric analysis (TGA) using a temperature ramp of 10° C./min starting at 25° C.

The curable flux composition of the present invention, optionally, further comprises a curing agent. Conventional curing agents can be used together with the resin component and the amine fluxing agent, provided that the curing agents can cure the resin component. Conventional curing agents include, for example, polyfunctional phenols, polyfunctional alcohols, amines, imidazole compounds, acid anhydrides, organic phosphorus compounds and their halides. Preferably, any curing agent used should be a latent curing agent (i.e., curing agent that does not operate to initiate the gelling of the resin component at temperatures of ≦225° C.) allowing for solder reflow without interference and facilitating storage stability for curable flux compositions in one pack systems.

The curable flux composition of the present invention, optionally, further comprises a solvent. Solvent is optionally included in the curable flux composition of the present invention to facilitate delivery of the resin component and the amine fluxing agent to the surface, or surfaces, to be soldered. Preferably, the curable flux composition contains 1 to 70 wt % solvent (more preferably 1 to 35 wt % solvent; most preferably 1 to 20 wt % solvent). Solvent used in the curable flux composition of the present invention is preferably an organic solvent selected from hydrocarbons (e.g., dodecane, tetradecane); aromatic hydrocarbons (e.g., benzene, toluene, xylene, trimethylbenzene, butyl benzoate, dodecylbenzene); ketones (e.g., methyl ethyl ketone, methyl isobutyl ketone, cyclohexanone); ethers (e.g., tetrahydrofuran, 1,4-dioxaneandtetrahydrofuran, 1,3-dioxalane, diprolylene glycol dimethyl ether); alcohols (e.g., 2-methoxy-ethanol, 2-butoxyethanol, methanol, ethanol, isopropanol, α-terpineol, benzyl alcohol, 2-hexyldecanol); esters (e.g., ethyl acetate, ethyl lactate, butyl acetate, diethyl adipate, diethyl phthalate, diethylene glycol monobutyl acetate, propylene glycol monomethyl ether acetate, ethyl lactate, methyl 2-hydroxyisobutyrate, propylene glycol monomethyl ether acetate); and, amides (e.g., N-methylpyrrolidone, N,N-dimethylformamide and N,N-dimethylacetamide); glycol derivatives (e.g., cellosolve, butyl cellosolve); glycols (e.g., ethylene glycol; diethylene glycol; dipropylene glycol; triethylene glycol; hexylene glycol; 1,5-pentanediol); glycol ethers (e.g., propylene glycol monomethyl ether, methyl carbitol, butyl carbitol); and petroleum solvents (e.g., petroleum ether, naptha). More preferably, the solvent used in the curable flux composition of the present invention is an organic solvent selected from methyl ethyl ketone; 2-propanol; propylene glycol monomethyl ether; propylene glycol monomethyl ether acetate; ethyl lactate and methyl 2-hydroxy isobutyrate. Most preferably, the solvent used in the curable flux composition of the present invention is propylene glycol monomethyl ether.

The curable flux composition of the present invention, optionally, further comprises a thickening agent. Preferably, the curable flux composition contains 0 to 30 wt % thickening agent. Thickening agent used in the curable flux composition of the present invention can be selected from non-curing resin materials (i.e., <2 reactive functional groups per molecule), such as, for example, a non-curing novolac resin. The thickening agent used in the curable flux composition, preferably exhibits a viscosity greater than that exhibited by the resin component (in its uncured form). When present, the thickening agent can be used in an amount of 0.1 to 35 wt %, based on the total weight of the curable flux composition.

The curable flux composition of the present invention, optionally, further comprises a thixotropic agent. Preferably, the curable flux composition contains 1 to 30 wt % thixotropic agent. Thixotropic agent used in the curable flux composition of the present invention can be selected from fatty acid amides (e.g., stearamide, hydroxystearic acid bisamide); fatty acid esters (e.g., castor wax, beeswax, carnauba wax); organic thixotropic agents (e.g., polyethylene glycol, polyethylene oxide, methyl cellulose, ethyl cellulose, hydroxyethyl cellulose, hydroxypropyl cellulose, diglycerine monooleate, deglycerine laurate, decaglycerine oleate, diglycerine monolaurate, sorbitan laurate); inorganic thixotropic agents (e.g., silica powders, kaolin powders). Preferably, the thixotropic agent used is selected from a polyethylene glycol and a fatty acid amide.

The curable flux composition of the present invention, optionally, further comprise an inorganic filler. Inorganic fillers can be selected from alumina, aluminum hydroxide, aluminosilicate, cordierite, lithium aluminum silicate, magnesium aluminate, magnesium hydroxide, clay, talc, antimony trioxide, antimony pentoxide, zinc oxide, colloidal silica, fused silica, glass powder, quartz powder and glass microspheres. When present, the curable flux composition of the present invention preferably contains 0 to 70 wt % (more preferably 0 to 35 wt %, still more preferably 0 to 20 wt %; most preferably 0.1 to 20 wt %) inorganic filler.

The curable flux composition of the present invention, optionally, further comprises an antioxidant. When present, the curable flux composition of the present invention preferably contains 0.01 to 30 wt % (more preferably 0.01 to 20 wt %) antioxidant.

The curable flux composition of the present invention optionally further comprises a reactive diluent. Preferably, the optional reactive diluent should exhibit a viscosity that is lower than the viscosity exhibited by the resin component (in its uncured form). Reactive diluent can preferably be selected from monofunctional epoxies (e.g., $C_{6-28}$ alkyl glycidyl ethers; $C_{6-28}$ fatty acid glycidyl esters; $C_{6-28}$ alkylphenol glycidyl ethers) and certain multifunctional epoxies (e.g., trimethylolpropane triglycidyl ether; diglycidyl aniline). When present, the reactive diluent can be used in an amount of <50 wt % (based on the weight of the resin component).

The curable flux composition of the present invention, optionally, further comprises a conventional air release agent. Air release agents are believed to enhance the wetting of the surfaces to be soldered during solder reflow. When present, the air release agent can be used in an amount of <1 wt %, based on the total weight of the curable flux composition.

The curable flux composition of the present invention, optionally, further comprises a conventional defoaming agent. Defoaming agents are believed to enhance the wetting of the surfaces to be soldered during solder reflow and to reduce gas inclusion defects upon curing of the curable flux composition. When present, the defoaming agent can be used in an amount of <1 wt % of the curable flux composition.

The curable flux composition of the present invention, optionally, further comprises a conventional adhesion promoter. Conventional adhesion promoters include silanes, such as, for example, glycidoxypropyl trimethoxysilane; γ-amino propyl trithosysilane; trimethoxysilylpropylated isocyanurate; β-(3,4-epoxycyclohexyl)ethyltriethoxysilane; glycidopropyl diethoxymethylsilane; β-(3,4-epoxycyclohexyl)ethyltrimethoxysilane; γ-glycidoxypropyltriethoxysilane; γ-mercaptopropyltrimethoxysilane; N-beta-(aminoethyl)-gama-aminopropyltrimethoxysilane; bis(trimethoxysilylpropyl)amine; and, γ-ureidopropyltriethoxysilane. When present, the adhesion promoter can be used in an amount of <2 wt % of the curable flux composition.

The curable flux composition of the present invention, optionally, further comprises a conventional flame retardant. Conventional flame retardants include bromo compounds (e.g., decabromodiphenyl ether, tetrabromobisphenol A, tetrabromophthalic anhydride, tribromophenol); phosphorus compounds (e.g., triphenyl phosphate, tricresyl phosphate, trixylyl phosphate, cresyl diphenyl phosphate); metal hydroxides (e.g., magnesium hydroxide, aluminum hydroxide); red phosphorus and its modified products; antimony compounds (e.g., antimony trioxide, antimony pentoxide); and, triazine compounds (e.g., melamine, cyanuric acid, melamine cyanurate). When present, the flame retardant can be used in an amount of 0.01 to 35 wt % (preferably 0.01 to 10 wt %) of the curable flux composition.

The curable flux composition of the present invention, optionally, further comprises additional additives selected from matting agents, coloring agents, dispersion stabilizers, chelating agents, thermoplastic particles, UV impermeable agents, leveling agents and reducing agents.

The curable flux composition of the present invention can be provided as a one pack system containing all of the ingredients. Alternatively, the curable flux composition can be provided as a two pack system; wherein the resin component is provided in a first part and the amine fluxing agent and, optional, curing agent are provided in a second part; and, wherein the first part and the second part are combined prior to use.

The curable flux composition of the present invention can be used in, for example, the production of electronic components, electronic modules and printed circuit boards. The curable flux composition can be applied to the surface(s) to be soldered by any conventional technique including liquid spray techniques, liquid foaming techniques, pick and dip techniques, wave techniques, or any other conventional technique capable of dispensing a liquid or semisolid onto a silicon die or substrate.

The curable flux composition of the present invention optionally further comprises a solder powder; wherein the curable flux composition is a solder paste. Preferably, the solder powder is an alloy selected from Sn/Pb, Sn/Ag, Sn/Ag/Cu, Sn/Cu, Sn/Zn, Sn/Zn/Bi, Sn/Zn/Bi/In, Sn/Bi and Sn/In (preferably wherein the solder powder is an alloy selected from 63 wt % Sn/37 wt % Pb; 96.5 wt % Sn/3.5 wt % Ag; 96 wt % Sn/3.5 wt % Ag/0.5 wt % Cu; 96.4 wt % Sn/2.9 wt % Ag/0.5 wt % Cu; 96.5 wt % Sn/3 wt % Ag/0.5 wt % Cu; 42 wt % Sn/58 wt % Bi; 99.3 wt % Sn/0.7 wt % Cu; 91 wt % Sn/9 wt % Zn and 89 wt % Sn/8 wt % Zn/3 wt % Bi).

The solder paste preferably comprises: 1 to 50 wt % (more preferably 5 to 30 wt %, most preferably 5 to 15 wt %) of a combination of a resin component with a fluxing complex (formed by the combination of a carboxylic acid and an amine fluxing agent represented by formula I); and, 50 to 99 wt % of a solder powder. The solder paste can be compounded by conventional techniques, for example, by kneading and mixing the solder powder with the amine fluxing agent and resin component using conventional equipment for such operations.

The solder paste can be used in, for example, the production of electronic components, electronic modules and printed circuit boards. The solder paste can be applied to the surface(s) to be soldered by any conventional technique including printing the solder paste through a conventional solder mask using a solder printer or screen printer.

The amine fluxing agent represented by formula I used in the curable flux composition of the present invention can be prepared using conventional synthesis techniques well known to those of ordinary skill in the art.

The fluxing complex used in the curable flux composition of the present invention can be prepared by, for example: (a) combining an amine fluxing agent according to formula I with a carboxylic acid (see, e.g., Example 5); or (b) adding a carboxylic acid at some point during the preparation of an amine fluxing agent according to formula I. Preferably, the fluxing complex used in the curable flux composition of the present invention is prepared by combining an amine fluxing agent according to formula I with a carboxylic acid. Optionally, a fluxing agent according to formula I and a carboxylic acid can be combined in a solvent (e.g., 1,3-dioxolane) to facilitate the formation of the fluxing complex. The solvent can then be evaporated off leaving behind the fluxing complex.

The method of forming a plurality of encapsulated electrical interconnects of the present invention can optionally be part of a flip chip soldering process, wherein a semiconductor chip is mounted onto a printed circuit board, wherein the semiconductor chip comprises a plurality of first electrical contacts and wherein the printed circuit board comprises a plurality of corresponding second electrical contacts. In such a flip chip process, the curable flux composition of present invention is applied to either one, or both, of the plurality of first electrical contacts and the plurality of corresponding second electrical contacts to facilitate solder bonding of the plurality of first electrical contacts to the plurality of corresponding second electrical contacts to form electrical inter connects. Preferably, the flip chip solder process further comprises a curing step wherein the resin component is cured, encapsulating the electrical inter connects between the plurality of first electrical contacts and the plurality of second electrical contacts.

During the method of forming a plurality of encapsulated electrical inter connects of the present invention, the curable flux composition of the present invention is preferably applied onto a printed circuit board, with or without a smoothing application, over the plurality of first electrical contacts. The solder is preferably applied to the plurality of corresponding second electrical contacts on the semiconductor chip in the form of solder balls. The semiconductor chip with solder attached is then disposed over the curable flux composition treated printed circuit board. The semiconductor chip is then aligned with the printed circuit board and the solder is heated above its reflow temperature. During reflow, the curable flux composition acts as a flux and promotes adhesive of the solder to the first plurality of electrical contacts on the printed circuit board forming a plurality of electrical inter connects between the plurality of first electrical contacts and the plurality of corresponding second electrical contacts. The resin component is then cured to encapsulate the plurality of electrical inter connects.

During reflow, the solder melts and flows to form the plurality of electrical inter connects. The curable flux composition preferably should not gel until after the solder has flowed and forms the plurality of electrical inter connects, otherwise the printed circuit board and the semiconductor chip may not align correctly. It is preferably that the resin component in the curable flux composition completely cure following solder reflow to form an encapsulated electrical joint.

Some embodiments of the present invention will now be described in detail in the following Examples.

Example 1

Synthesis of Amine Fluxing Agent

A 2,6-diamino-2,5,6-trimethylheptan-3-ol amine fluxing agent was prepared using the following procedure. First, a 2,5,6-trimethyl-2,6-dinitroheptan-3-ol intermediate was prepared using the following synthesis method

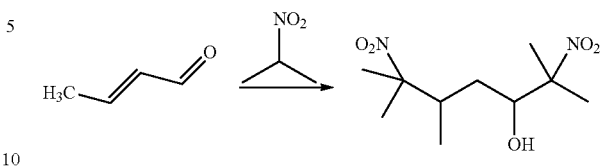

Specifically, a three neck round bottom flask was equipped with a stir bar, a thermocouple, a dropping funnel capped with a nitrogen inlet and a condenser. The flask was then charged with 2-nitropropane (50 g, 0.56 mol, 5.0 equivalents) and a catalytic amount of 1,8-diazabicyclo[5.4.0]undec-7-ene. The contents of the flask were then stirred under nitrogen for thirty minutes. Then crotonaldehyde (7.9 g, 9.2 mL, 0.112 moles, 1.0 equivalent) was added to the flask drop-wise over a period of twenty minutes. The contents of the flask were then stirred under nitrogen for 5-6 hours, during which a white solid was observed to precipitate from the solution. At this point, GC analysis showed the absence of any crotonaldehyde in the reaction mixture. The contents of the flask were allowed to stir overnight under nitrogen. The precipitate was then vacuum filtered from the solution and was washed thoroughly with water yielding a white solid. The intermediate solid was air dried, followed by vacuum drying at 45° C. The total yield of the desired intermediate dinitro alcohol was 72% (27.8 g). Nuclear magnetic resonance testing ("NMR") and liquid chromatography ("LC") showed that the intermediate was >99% pure.

Second, the product 2,6-diamino-2,5,6-trimethylheptan-3-ol amine fluxing agent was then prepared from the intermediate dinitro alcohol using the following synthesis method

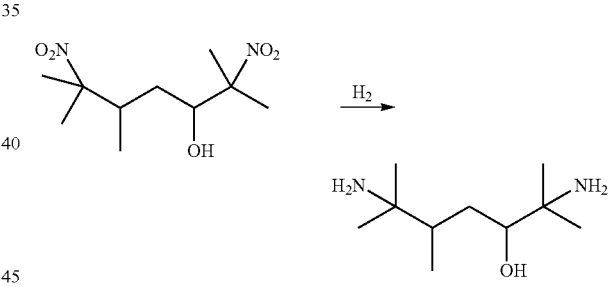

Specifically, 25 g of the intermediate dinitro alcohol was dissolved in 200 mL methanol with 14.2 g of RaNi 3111 as a catalyst. The mixture was then hydrogenated in an autoclave at 60° C. under 4,137 kPa (600 psi) of hydrogen pressure. After workup which included filtration of the catalyst and removal of methanol, 11 g (59% yield) of a low viscosity liquid product was obtained. NMR and gas chromatograph-mass spectroscopy ("GC-MS") analysis confirmed the presence of the desired product 2,6-diamino-2,5,6-trimethylheptan-3-ol amine fluxing agent. Chemical ionization mass spectroscopy (CI-MS) showed [M+H]=189 and GC analysis showed that the purity of the product to be 94%. The boiling point of the material was 125° C. to 135° C. at 0.68 kPa (5.1 torr). $^{13}$C NMR (CDCl$_3$): δ 16.8, 25.2, 27.9, 30.8, 34.7, 42.2, 51.8, 52.8 and 77.3 ppm.

Example 2

Synthesis of Amine Fluxing Agent

A 2,6-diamino-2,6-dimethyl-5-phenylheptan-3-ol amine fluxing agent was prepared using the following procedure.

First, a 2,6-dimethyl-2,6-dinitro-5-phenylheptan-3-ol intermediate was prepared using the following synthesis method

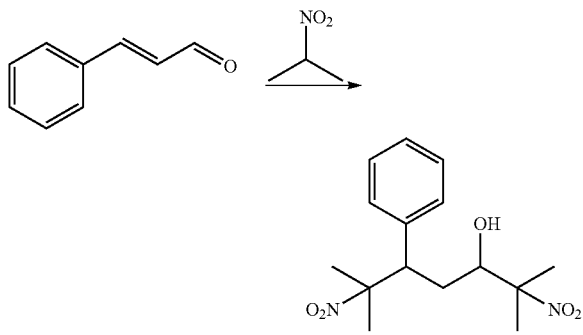

Specifically, a three neck round bottom flask was equipped with a stir bar, a thermocouple, a dropping funnel capped with a nitrogen inlet and a condenser. The flask was then charged with 2-nitropropane (101.1 g, 1.14 mols, 6.0 equivalents) and a catalytic amount of 1,8-diazabicyclo[5.4.0]undec-7-ene ("DBU"). The contents of the flask were then stirred under nitrogen for twenty minutes. Then trans-cinnamaldehyde (25.0 g, 0.19 moles, 1.0 equivalent) was added to the flask drop-wise over a period of twenty minutes. During the addition of the trans-cinnamidehyde, an exotherm of approximately 22° C. was observed. Following the complete addition of the trans-cinnamaldehyde, the flask contents were heated to 50° C. and maintained at that temperature for 4 hours. The mixture was then allowed to cool to room temperature. When the flask contents reached 36.8° C., a pale yellow solid formed out of the solution. The flask contents were then filtered through a Buchner funnel and the recovered intermediate diamino alcohol powder was washed thoroughly with pentane and ether. The intermediate diamino alcohol powder was then left to dry under vacuum for 1 hour. The total yield of the desired diamino alcohol intermediate was 62% (36 g). NMR analysis showed that the diamino alcohol intermediate was >99% pure. $^1$H NMR (CDCl$_3$): δ 1.45-2.27 (m, 15H), 3.52-3.54 (m, 1H), 3.67-3.74 (m, 1H), 7.17-7.34 (m, 5H). $^{13}$C NMR (CDCl$_3$): δ 20.8, 22.4, 23.2, 25.8, 31.3, 50.3, 72.9, 91.5, 91.6, 128.1, 128.7, 129.4, 136.6 ppm.

Second, the product 2,6-diamino-2,6-dimethyl-5-phenylheptane-3-ol amine fluxing agent was then prepared from the dinitro alcohol intermediate using the following synthesis method

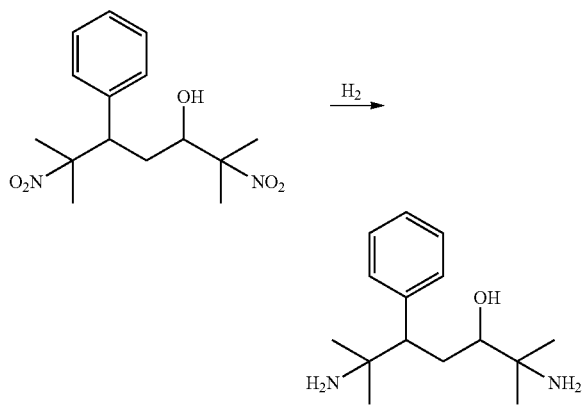

Specifically, 50 g of the dinitro alcohol intermediate was dissolved in 300 mL methanol with 24.3 g of RaNi 3111 as a catalyst. The mixture was then hydrogenated in an autoclave at 60° C. under 4137 kPa (600 psi) of hydrogen pressure. After workup which included filtration of the catalyst and removal of methanol, 40 g (68% yield) of a high viscosity liquid product was obtained. NMR and gas chromatograph-mass spectroscopy ("GC-MS") analysis confirmed the presence of the desired product 2,6-diamino-2,6-dimethyl-5-phenylheptane-3-ol amine fluxing agent. Chemical ionization mass spectroscopy (CI-MS) showed [M+H]=251 and GC analysis showed that the purity of the product to be 78% straight from the autoclave. The rest of the material present appeared to be the mono adduct obtained from the reversal of the Henry reaction. The product was then purified to 96.2% purity by vacuum distillation. The boiling point of the purified product was determined to be 150° C. to 160° C. at 0.67 kPa (5.0 torr). $^1$H NMR (CDCl$_3$): δ 0.91-0.99 (m, 12H), 1.67-1.81 (m, 3H), 2.71-2.76 (m, 2H), 7.08-7.23 (m, 5H). $^{13}$C NMR (CDCl$_3$): δ 24.6, 27.9, 28.3, 29.8, 31.6, 51.8, 52.6, 54.2, 75.9, 126.3, 127.8, 129.4, 142.0 ppm.

Example 3

Synthesis of Amine Fluxing Agent

An amine fluxing agent having the formula

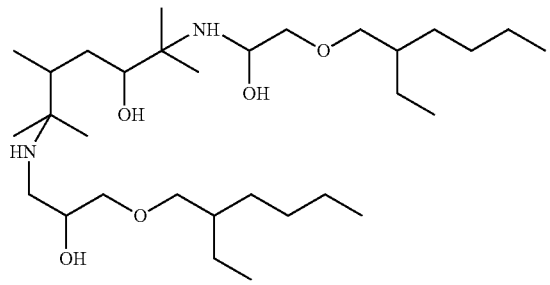 [SMILES: CCCCC(CC)COCC(O)CNC(C)(C)C(C)CC(O)C(C)(C)NC(O)COCC(CC)CCCC]

was prepared using the following procedure. Specifically, into a reaction vessel with a stir bar, (0.05 mol) of the product of Example 1 was added. The reaction vessel was then placed on a hotplate with magnetic stirring capability. The reaction vessel was then inerted with nitrogen and (0.1 mol) of 2-ethylhexyl glycidyl ether (available from Momentive Performance Materials) was then added to the reaction vessel at ambient temperature, with stirring. The set point temperature on the hot plate was then raised to 75° C. and the contents of the reaction vessel were allowed to continue stirring for two (2) hours. The set point temperature of the hot plate was then raised to 140° C. and the contents of the reaction vessel were allowed to continue stirring for two (2) more hours. The set point temperature of the hot plate was then reduced to 80° C. and a vacuum was pulled on the reaction vessel, reducing the pressure in the vessel to 30 mm Hg. The contents of the reaction vessel were allowed to continue stirring under these conditions for another two (2) hours to provide the product fluxing agent. The percent weight loss from the product fluxing agent upon heating to 250° C. was measured by thermogravimetric analysis (TGA) using a temperature ramp of 10° C./min starting at 25° C. The measured weight loss (WL) for the product fluxing agent was 9 wt %.

Example 4

Synthesis of Amine Fluxing Agent

An amine fluxing agent having the formula

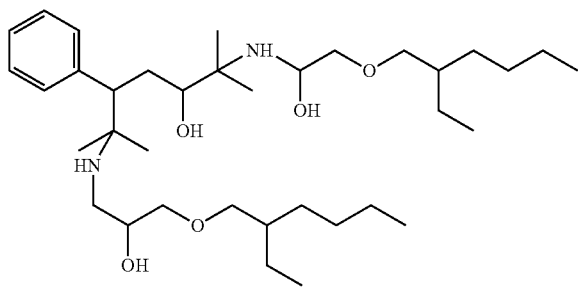 [SMILES: CCCCC(CC)COCC(O)CNC(C)(C)C(CC(O)C(C)(C)NC(O)COCC(CC)CCCC)c1ccccc1]

was prepared using the following procedure. Specifically, into a reaction vessel with a stir bar, (0.05 mol) of the product of Example 2 was added. The reaction vessel was then placed on a hotplate with magnetic stirring capability. The reaction vessel was then inerted with nitrogen and (0.1 mol) of 2-ethylhexyl glycidyl ether (available from Momentive Performance Materials) was then added to the reaction vessel at ambient temperature, with stirring. The set point temperature on the hot plate was then raised to 75° C. and the contents of the reaction vessel were allowed to continue stirring for two (2) hours. The set point temperature of the hot plate was then raised to 140° C. and the contents of the reaction vessel were allowed to continue stirring for two (2) more hours. The set point temperature of the hot plate was then reduced to 80° C. and a vacuum was pulled on the reaction vessel, reducing the pressure in the vessel to 30 mm Hg. The contents of the reaction vessel were allowed to continue stirring under these conditions for another two (2) hours to provide the product fluxing agent. The percent weight loss from the product fluxing agent upon heating to 250° C. was measured by thermogravimetric analysis (TGA) using a temperature ramp of 10° C./min starting at 25° C. The measured weight loss (WL) for the product fluxing agent was 5 wt %.

Example 5

Preparation of Fluxing Complex

An amine fluxing agent (4 g) prepared according to the procedure set forth in Example 3 was hand mixed with 1,4-dihydroxy-2-naththoic acid (0.37 g) in 1,3-dioxolane (1.5 g) under ambient conditions to form a fluxing complex having an amine fluxing agent amine nitrogen to carboxylic acid acid content (—COOH) equivalent ratio of about 2:1. The 1,3-dioxolane was removed from the fluxing complex by heating to 80° C. for thirty minutes.

The percent weight loss from the fluxing complex upon heating to 230° C. was then measured by thermogravimetric analysis (TGA) using a temperature ramp of 10° C./min starting at 25° C. The measured weight loss (WL) for the fluxing complex was 20.2 wt %.

Example 6

Preparation of Fluxing Complex

An amine fluxing agent (4 g) prepared according to the procedure set forth in Example 4 was hand mixed with 1,4-dihydroxy-2-naththoic acid (0.37 g) under ambient conditions using a spatula to form a fluxing complex having an amine fluxing agent amine nitrogen to carboxylic acid acid content (—COOH) equivalent ratio of 1.8:1.

The percent weight loss from the fluxing complex upon heating to 250° C. was measured by thermogravimetric analysis (TGA) using a temperature ramp of 10° C./min starting at 25° C. The measured weight loss (WL) for the fluxing complex was 13.6 wt %.

Examples 7

Preparation of Curable Flux Composition

The fluxing complex prepared according to Example 6 was combined with a liquid epoxy resin reaction product of epichlorohydrin and bisphenol A (available from The Dow Chemical Company as D.E.R.™ 331™) at a 1:1 weight ratio to form a curable flux composition.

Example 8

Evaluation of Fluxing Capability

The fluxing capability of the curable flux composition prepared according to Example 7 was evaluated using the following procedure. A copper coupon was used as an electrical contact to be soldered. A small drop of the curable flux composition prepared according to Example 7 was dispensed onto the surface to be soldered of the copper coupon. Four 0.381 mm diameter balls of a lead-free solder (95.5 wt % Sn/4.0 wt % Ag/0.5 wt % Cu) were placed into the drop of fluxing complex on the copper coupon. The melting range of the lead-free solder used was 217 to 221° C. The copper coupon was then placed on a hotplate that was preheated to 145° C. and held there for two (2) minutes. The copper coupons were then placed on another hotplate preheated to 260° C. and held there until the solder reached reflow conditions. The copper coupon was then removed from the heat and evaluated by (a) the extent of fusion and coalescence of the originally placed four solder balls, (b) the size of the resulting coalesced solder to assess the flow and spread and (c) the bonding of the solder to the surface of the copper coupon. The fluxing capability of the curable flux composition was determined to be a 4 on a scale of 0 to 4, wherein:

0=no fusion between solder drops and no solder bonding to copper coupon;

1,2=partial to complete fusion between solder drops, but no solder bonding to copper coupon;

3=complete fusion between solder drops, but minimal solder spread and flow;

4=complete fusion between solder drops, good solder spread and flow over surface of copper coupon and solder bonding to the copper coupon.

We claim:

1. A curable flux composition, comprising, as initial components:

a resin component having at least two oxirane groups per molecule;

a carboxylic acid;

an amine fluxing agent represented by formula I:

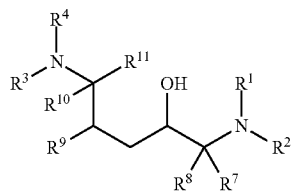

wherein $R^1$, $R^2$, $R^3$ and $R^4$ are independently selected from a hydrogen, a substituted $C_{1-80}$ alkyl group, an unsubstituted $C_{1-80}$ alkyl group, a substituted $C_{7-80}$ arylalkyl group and an unsubstituted $C_{7-80}$ arylalkyl group; wherein $R^7$ and $R^8$ are independently selected from a $C_{1-20}$ alkyl group, a substituted $C_{1-20}$ alkyl group, a $C_{6-20}$ aryl group and a substituted $C_{6-20}$ aryl group or wherein $R^7$ and $R^8$, together with the carbon to which they are attached, form a $C_{3-20}$ cycloalkyl ring optionally substituted with a $C_{1-6}$ alkyl group; wherein $R^{10}$ and $R^{11}$ are independently selected from a $C_{1-20}$ alkyl group, a substituted $C_{1-20}$ alkyl group, a $C_{6-20}$ aryl group and a substituted $C_{6-20}$ aryl group or wherein $R^{10}$ and $R^{11}$, together with the carbon to which they are attached, form a $C_{3-20}$ cycloalkyl ring optionally substituted with a $C_{1-6}$ alkyl group; and, wherein $R^9$ is selected from a hydrogen, a $C_{1-30}$ alkyl group, a substituted $C_{1-30}$ alkyl group, a $C_{6-30}$ aryl group and a substituted $C_{6-30}$ aryl group; and,
optionally, a curing agent.

2. The curable flux composition of claim 1, wherein the carboxylic acid is selected from the group consisting of a $C_{8-20}$ aliphatic mono carboxylic acids; $C_{2-20}$ aliphatic dicarboxylic acids; $C_{6-20}$ aromatic carboxylic acids; and, mixtures thereof.

3. The curable flux composition of claim 2, wherein the carboxylic acid is selected from the group consisting of octanoic acid; nonanioc acid; undecanoic acid; dodecanoic acid; tridecanoic acid; tetradecanoic acid; pentadecanoic acid; hexadecanoic acid; heptadecanoic acid; stearic acid; hydroxy stearic acid; oleic acid; linoleic acid; α-linolenic acid; icosanoic acid; oxalic acid; malonic acid; succinic acid; malic acid; glutaric acid; adipic acid; pimelic acid; suberic acid; benzoic acid; phthalic acid; isophthalic acid; terephthalic acid; hemimellitic acid; trimellitic acid; trimesic acid; mellophanic acid; prehnitic acid; pyromellitic acid; mellitic acid; toluic acid; xylic acid; hemellitic acid; mesitylene acid; prehnitic acid; cinnamic acid; salicylic acid; benzoic acid; naphthoic acid; phenolphthalin; diphenolic acid and mixtures thereof.

4. The curable flux composition of claim 1, wherein the flux composition exhibits a fluxing agent amine nitrogen to carboxylic acid content (—COOH) equivalent ratio of 1:1 to 20:1.

5. The curable flux composition of claim 1, wherein the substitutions in the substituted $C_{1-80}$ alkyl group and the substituted $C_{7-80}$ arylalkyl group, from which $R^1$, $R^2$, $R^3$ and $R^4$ are selected, are selected from at least one of an —OH group, an —$OR^5$ group, a —$COR^5$— group, a —$COR^5$ group, a —$C(O)R^5$ group, a —CHO group, a —$COOR^S$ group, an —$OC(O)OR^5$ group, a —$S(O)(O)R^5$ group, a —$S(O)R^5$ group, a —$S(O)(O)NR^5{}_2$ group, an —$OC(O)NR^6{}_2$ group, a —$C(O)NR^6{}_2$ group, a —CN group, a —$N(R^6)$— group and a —$NO_2$ group; wherein $R^5$ is selected from a $C_{1-28}$ alkyl group, a $C_{3-28}$ cycloalkyl group, a $C_{6-15}$ aryl group, a $C_{7-28}$ arylalkyl group and a $C_{7-28}$ alkylaryl group; wherein $R^6$ is selected from a hydrogen, a $C_{1-28}$ alkyl group, a $C_{3-28}$ cycloalkyl group, a $C_{6-15}$ aryl group, a $C_{7-28}$ arylalkyl group and a $C_{7-28}$ alkylaryl group.

6. The curable flux composition of claim 1, wherein one to three of $R^1$, $R^2$, $R^3$ and $R^4$ is(are) hydrogen.

7. The curable flux composition of claim 1, wherein $R^1$, $R^2$, $R^3$ and $R^4$ are independently selected from a hydrogen, a —$CH_2CH(OH)R^{18}$ and a —$CH_2CH(OH)CH_2$—O—$R^{18}$ group; wherein $R^{18}$ is selected from a hydrogen, a $C_{1-28}$ alkyl group, a $C_{3-28}$ cycloalkyl group, a $C_{6-28}$ aryl group, a $C_{7-28}$ arylalkyl group and a $C_{7-28}$ alkylaryl group; wherein $R^7$ and $R^8$ are both a methyl group; wherein $R^{10}$ and $R^{11}$ are both a methyl group; and, wherein $R^9$ is selected a methyl group and a phenyl group; and wherein zero to three of $R^1$, $R^2$, $R^3$ and $R^4$ is(are) hydrogen.

8. The curable flux composition of claim 4, wherein one of $R^1$ and $R^2$ is hydrogen; and wherein one of $R^3$ and $R^4$ is hydrogen.

9. The curable flux composition of claim 1, further comprising: a solder powder.

10. A process of forming an encapsulated metallurgical joint, comprising:
providing a curable flux composition according to claim 1;
providing a plurality of first electrical contacts;
providing a plurality of corresponding second electrical contacts;
providing a solder;
applying the curable flux composition to at least one of the plurality of first electrical contacts and the plurality of corresponding second electrical contacts;
placing the plurality of first electrical contacts in proximity to the plurality of corresponding second electrical contacts;
heating the solder above its reflow temperature forming a molten solder and exposing the molten solder to the plurality of first electrical contacts and the plurality of corresponding second electrical contacts;
displacing the curable flux composition from the plurality of first electrical contacts and the plurality of corresponding second electrical contacts with the molten solder and forming a plurality of electrical inter connects between the plurality of first electrical contacts and the plurality of corresponding second electrical contacts; and,
curing the resin component, encapsulating the plurality of electrical inter connects.

* * * * *